US009009955B2

(12) United States Patent
Slade et al.

(10) Patent No.: US 9,009,955 B2
(45) Date of Patent: Apr. 21, 2015

(54) METHOD OF MAKING AN ELECTRONICALLY ACTIVE TEXTILE ARTICLE

(75) Inventors: Jeremiah Slade, Shirley, MA (US); Andrew Houde, Lowell, MA (US); Patricia Wilson, Arlington, MA (US)

(73) Assignee: Infoscitex Corporation, Littleton, MA (US)

( * ) Notice: Subject to any disclaimer, the term of this patent is extended or adjusted under 35 U.S.C. 154(b) by 787 days.

(21) Appl. No.: 12/804,957

(22) Filed: Aug. 3, 2010

(65) Prior Publication Data

US 2012/0030935 A1 Feb. 9, 2012

(51) Int. Cl.

| | |
|---|---|
| ***H05K 3/00*** | (2006.01) |
| ***H01R 12/61*** | (2011.01) |
| *A41D 1/00* | (2006.01) |

(52) U.S. Cl.

CPC ................ *H01R 12/61* (2013.01); *A41D 1/002* (2013.01)

(58) Field of Classification Search

CPC ...... B29C 53/56; B29C 65/00; H01R 9/0512; H01R 4/723; H01R 4/625; H01R 12/59

USPC ........... 29/854, 835–836, 825, 829, 831–832, 29/592.1, 862; 438/800, 51; 2/905, 243.1; 156/73.1, 92–93, 272.8, 250; 174/74 R, 174/75 C, 84 R, 78; 428/196–198; 439/98–100; 442/205–208, 181

See application file for complete search history.

(56) References Cited

U.S. PATENT DOCUMENTS

| | | | | |
|---|---|---|---|---|
| 4,874,124 | A | 10/1989 | Johns et al. | |
| 5,269,860 | A * | 12/1993 | Rice | 156/73.1 |
| 5,906,004 | A * | 5/1999 | Lebby et al. | 2/1 |
| 6,026,512 | A * | 2/2000 | Banks | 2/69 |
| 6,080,690 | A * | 6/2000 | Lebby et al. | 442/209 |
| 6,210,771 | B1 | 4/2001 | Post et al. | |
| 6,381,482 | B1 | 4/2002 | Jayaraman et al. | |
| 6,611,962 | B2 | 9/2003 | Redwood et al. | |
| 6,687,523 | B1 | 2/2004 | Jayaraman et al. | |
| 6,729,025 | B2 * | 5/2004 | Farrell et al. | 29/854 |
| 6,852,395 | B2 * | 2/2005 | Dhawan et al. | 428/196 |
| 7,022,917 | B2 | 4/2006 | Jung et al. | |
| 7,329,323 | B2 | 2/2008 | Dhawan et al. | |
| 7,348,285 | B2 * | 3/2008 | Dhawan et al. | 442/229 |
| 2003/0211797 | A1 * | 11/2003 | Hill et al. | 442/205 |
| 2012/0030935 | A1 * | 2/2012 | Slade et al. | 29/825 |

OTHER PUBLICATIONS

United States Army, Wearable Electronic Network Made from Discrete Parts, Government Solicitation No. A06-176, May 2006, (one (1) page).

* cited by examiner

*Primary Examiner* — Minh Trinh

(74) *Attorney, Agent, or Firm* — Iandiorio Teska & Coleman, LLP

(57) ABSTRACT

A method of making articles from electrically active textiles. First and second fabric pieces include conductors therein. A seam is established between the first and second fabric pieces. A determination is made, at the seam, based on one or more predetermined factors, which conductors of the first fabric piece intersect or overlap with which conductors of the second fabric piece. At the seam, an electrical and mechanical connection is formed between select conductors of the first fabric piece and select conductors of the second fabric piece.

10 Claims, 6 Drawing Sheets

METHOD OF MAKING AN ELECTRONICALLY ACTIVE TEXTILE ARTICLE

GOVERNMENT RIGHTS

Aspects of this invention were made with U.S. Government support under Contract No. W911QY-07-C-0019 and W911QY-07-C-0097 awarded by the U.S. Army. The Government may have certain rights in the subject invention.

FIELD OF THE INVENTION

The subject invention relates to electrically active textiles and articles such as garments made therefrom.

BACKGROUND OF THE INVENTION

U.S. Pat. No. 6,210,771, incorporated herein by this reference, arguably discloses a first electrically active textile article. For example, a shirt made of fabric includes regular (e.g., cotton or silk) fibers running in the warp direction and conductive fibers which run in the weft direction. The conductive fibers running in the weft direction can be used to interconnect electrical and electronic components (e.g., resistors, capacitors, integrated circuits, and the like) whose leads and pins are soldered to the conductive fibers.

Since U.S. Pat. No. 6,210,771 issued in 2001, those skilled in the art have generally sought to refine and improve upon the basic idea of U.S. Pat. No. 6,210,771. One limitation associated with such an electrically active textile is comfort. The conductive fibers running in the weft direction do not feel as comfortable as cotton fibers or cotton and nylon blends. Also, the conductive fibers do not behave or wear the same as regular textile fibers.

In addition, in the clothing industry, fabric is typically cut into pieces according to a pattern. These pieces are then sewn together. At the seam between a shirt sleeve and the body of the shirt, for example, the conductive fibers in the sleeve do not make electrical contact with the conductive fibers in the shirt body. Also, if the conductive fibers run only in one direction, for example, longitudinally up and down the length of the shirt, an electrical component on the left hand side of the shirt cannot be easily connected to an electrical component on the right hand side of the shirt.

If insulated wires are present in both the weft and the warp directions, connecting a weft wire to a warp wire means stripping both wires of insulation and soldering them together. Resistance welding is discussed in U.S. Pat. No. 7,329,323 incorporated herein by this reference. When insulated wires are used, a solvent must be employed to dissolve the insulation before resistive welding can be accomplished. To terminate signal lines or to avoid unwanted connections, U.S. Pat. No. 6,210,771 suggests cutting the conductive fibers. Thus, numerous manual operations are required.

The field of electrotextiles is thus nearly a decade old with only a few small volume test product launches in the consumer sector. The stagnancy in the development of further improvements is due in part to the lack of cooperation and coordination between the various electronic and textile component manufacturers and system integrators. Efforts to foster such communication between these industries are hampered by their lack of a common language or standardized components.

Additional prior art includes U.S. Pat. Nos. 6,729,025; 6,852,395; 4,874,124; 6,381,482; 6,687,523; 7,022,917; and 6,611,962, all incorporated herein by this reference.

BRIEF SUMMARY OF THE INVENTION

The subject invention features, in one aspect, a method of making electrical connections that bridge seam boundaries to form continuous network paths. These capabilities form the centerpiece of an e-textile tool kit—the key aspects of which, if standardized, will make it possible to realize development cycles for e-textile devices that are both realistic and economical.

In one particular example, a more comfortable and versatile electronic fabric is effected by weaving conventional yarn wrapped with small insulated wires. Termination of signal lines and unwanted connections are not a concern since the wires are insulated. But now, to electrically connect groups of these conductors, ultrasonic welding can be used. During ultrasonic welding at a seam, for example, or to connect warp conductors to weft conductors, the plastic insulation of the wires melt, the polymer material (e.g., nylon) in the yarn melts, and the conductive cores of the wires come into contact with each other. Then, after the ultrasonic energy is stopped, the polymer material of the yarn and insulation cools, hardens, and retains the conductive cores of the wires in contact with each other. The result is a durable, easily achieved interconnection amongst selected conductors in an e-textile fabric, garment, or article.

The subject invention features a method of making articles from an electrically active textile. One preferred method comprises assembling a first fabric piece including conductors therein and assembling a second fabric piece including conductors therein. A seam is established between the first and second fabric pieces. At the seam, based on one or more predetermined factors, a determination is made regarding which conductors of the first fabric piece intersect with which conductors of the second fabric piece. An electrical and mechanical connection is then formed between select conductors of the first fabric piece and select conductors of the second fabric piece.

The conductors may include a polymeric insulation about them and/or each fabric piece includes a polymeric material therein. Forming an electrical and mechanical connection typically includes choosing an ultrasonic horn head configured to melt any insulation about the select intersecting conductors and any polymeric material proximate the intersection of the select conductors. Forming an electrical and mechanical connection may include, for fabrics without any polymeric content, adding a polymeric patch to the intersection of the select conductors.

In one example, the conductors include one or more insulated wires wrapped about a fiber. Typically, the conductors are woven in the fabric pieces. The predetermined factors may include the seam type, the distance between conductors in each fabric piece, and/or any twist between the first and second fabric pieces at the seam. When overlapping conductors at the seam form Moiré fringe lines, the predetermined factors may further include the distance between the fringe lines and/or the angle at which they extend.

The subject invention also features a method comprising wrapping one or more insulated wires about a fiber including a polymeric material to render said fiber a conductor, weaving a plurality of said conductors into a fabric, cutting the fabric into pieces according to a pattern, and assembling the pieces together via seams to form a garment or article. The preferred method further includes electrically connecting at least select conductors at a seam by laying the seam on a platen, applying an ultrasonic horn to at least a portion of the seam, applying pressure to the ultrasonic horn, energizing the ultrasonic horn to melt the insulation of the wires and the polymeric material, deenergizing the ultrasonic horn, and allowing the polymeric material to cool encapsulating the wires.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
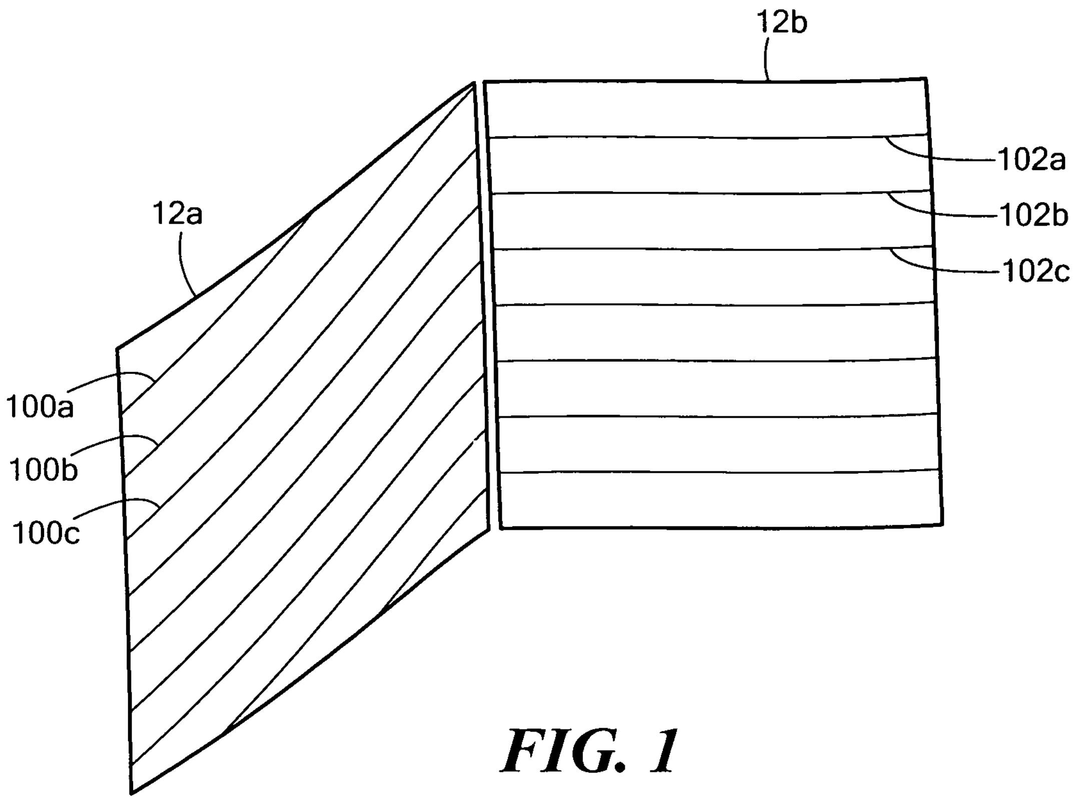
FIG. 1 is schematic front view showing two fabric pieces each including conductors therein.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the background section above, it is not always obvious how to join the conductors 100*a*, 100*b*, and 100*c*, FIG. 1 and the like of fabric piece 12*a* to the conductors 102*a*, 102*b*, 102*c*, and the like of fabric piece 12*b*. If a fabric piece 12*a* is cut at an angle as shown, then not all of the conductors 100 of fabric piece 12*a* will line up with and intersect or overlap with the conductors 102 of fabric piece 12*b* even if the seam between the two is a simple overlap-type seam LSa.

Figure 2:
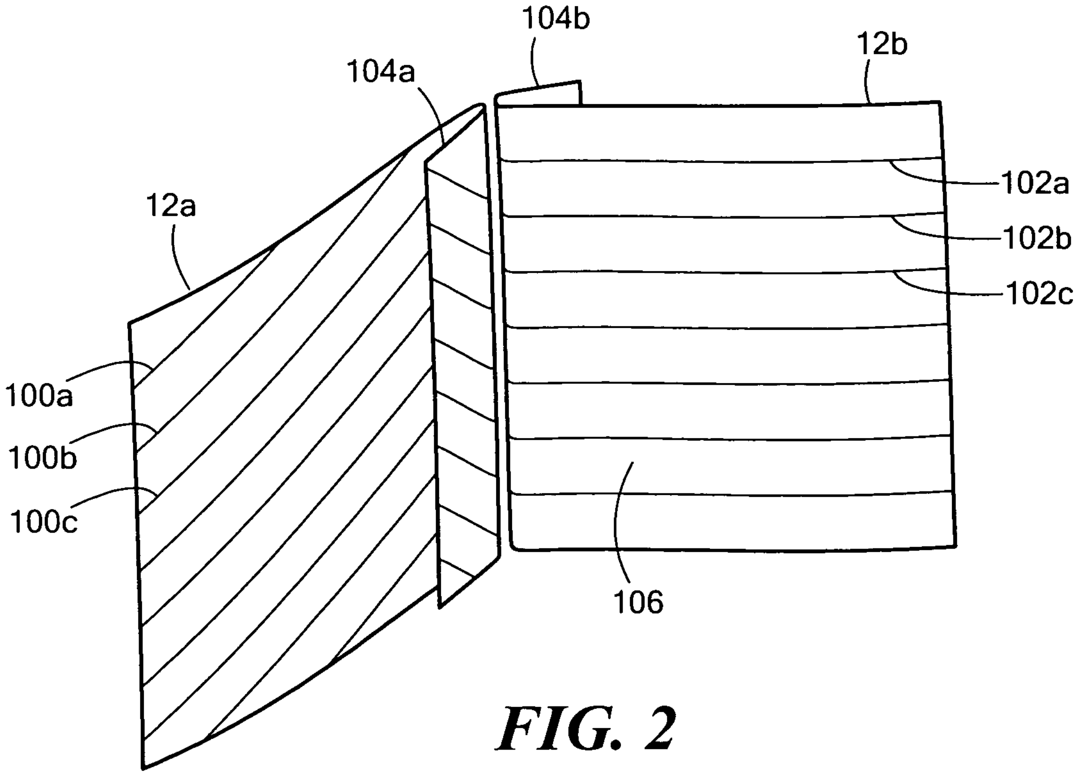
FIG. 2 is a schematic front view showing the formation of one example of a seam between the two fabric pieces depicted in FIG. 1.
Figure 3:
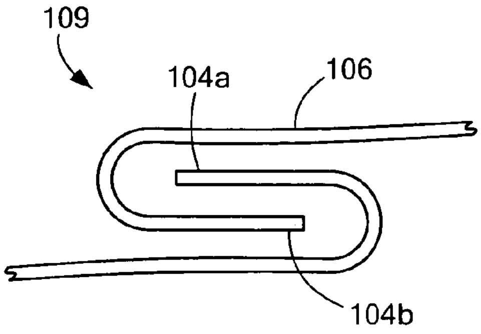
FIG. 3 is a schematic end view of the seam depicted in FIG. 2.

Moreover, consider the seam-type shown in FIGS. 2-3 LSc-2 where folded portion 104*a* of fabric piece 12*a* is positioned on or over folded portion 104*b* of fabric piece 12*b* and under or behind main panel 106 thereof as shown. Again, fabric piece 12*a* is cut at an angle.

In such a seam-type, conductor 100*a* in fabric piece 12*a*, FIG. 2 will actually intersect or overlap both conductors 102*a* and 102*b* in fabric piece 12*b*. It may not always be desirable for conductor 100*a* to be electrically connected to both conductors 102*a* and 102*b*.

When the fabric pieces include conductors running in both the well and warp directions, the problem is only compounded. A single conductor in one fabric piece may intersect, at the seam, with other conductors in the very same fabric piece and also intersect with numerous conductors in the other fabric piece. Running an ultrasonic horn along the length of seam 110, FIG. 3 will most likely result in numerous unintended conductor interconnections. Worse, at the seam, one cannot physically tell which conductors intersect. Using an ultrasonic horn to make spot connections may also result in numerous unintended conductor interconnections and/or the connections which are made will not be known after the seaming operation.

In accordance with the subject invention, a determination is made, before the seaming operation takes place, which conductors of a first fabric piece intersect or overlap with which conductors of a second fabric piece. Then, at the seam, electrical and mechanical connections are formed between only select conductors of the first fabric piece and select conductors of the second fabric piece.

Typically, the conductors are insulated. Using an ultrasonic horn to perform an electrical and mechanical connection at the intersection of two such conductors melts the insulation about the wires. Typically, the fabric also includes non-conductive fibers including a polymeric material. Using an ultrasonic horn to perform the electrical and mechanical connection results in melting this polymeric material proximate the intersection of two selected wires. When the melted polymeric material cools, it mechanically locks the now electrically connected wires together and simultaneously insulates them.

In other embodiments, the conductors include non-insulated wire, a non-conductive fiber core wrapped or twisted with a thin conductive strip or wire, an insulated non-conductive fiber core wrapped or twisted with a thin conductive strip or wire, a conductive fiber core wrapped or twisted with a thin conductive strip or wire, an insulated conductive fiber core wrapped or twisted with a thin conductive strip or wire, a conductive thread of solid materials such as stainless steel, an insulated conductive thread or solid metal such as stainless steel, a conductive thread where the fiber core is non-conductive and the outer plating is conductive (e.g., silver coated nylon or multi-alloy coated polymer fiber) and/or conductive polymer yarns.

Figure 4:
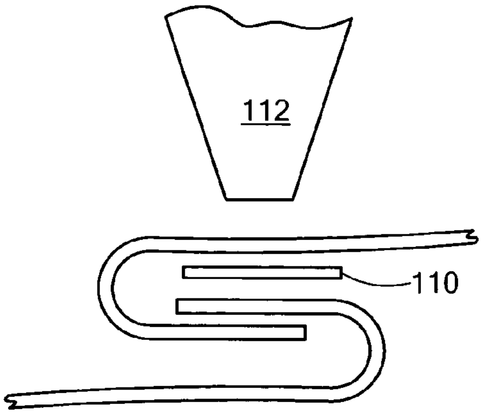
FIG. 4 is a highly schematic end view showing the application of an ultrasonic horn to form, at the seam between two fabric pieces, an electrical and mechanical connection between select conductors of the first fabric piece and select conductors of the second fabric piece.

The non-conductive fibers present in the fabric pieces could also be a blend of synthetic and natural fibers (e.g., nylon and cotton) or natural fibers. If there is no polymeric material at all in the seam (either in the conductors or in the fabric), a polymeric patch 110, FIG. 4 can be added at the seam. Ultrasonic horn 112 then melts this patch and the melted polymer material permeates the fabric pieces. When the melt cools, the wires are locked together in place as described above. The various fabrics used could thus be synthetic, natural, a blend of synthetic and natural fibers, and the like.

The electrical network present in the fabric could be conductors in the fabric separated by non-conductive threads or yarns, conductors in the warp and/or weft direction, or coarse and/or wale directions. The fabrics can be woven, knit, non-woven, or braided.

So far, the electrical and mechanical connections at the seam have involved the use of an ultrasonic horn. Typically, the head of the ultrasonic horn is chosen to have a configuration which, upon energizing the horn, establishes an electrical and mechanical connection between the conductors selected ahead of time. When the conductors include insulated wires and the fabric includes a polymer, the horn melts the insulation about the select conductors and also any polymeric material present at the intersection of the select conductors.

Figure 5:
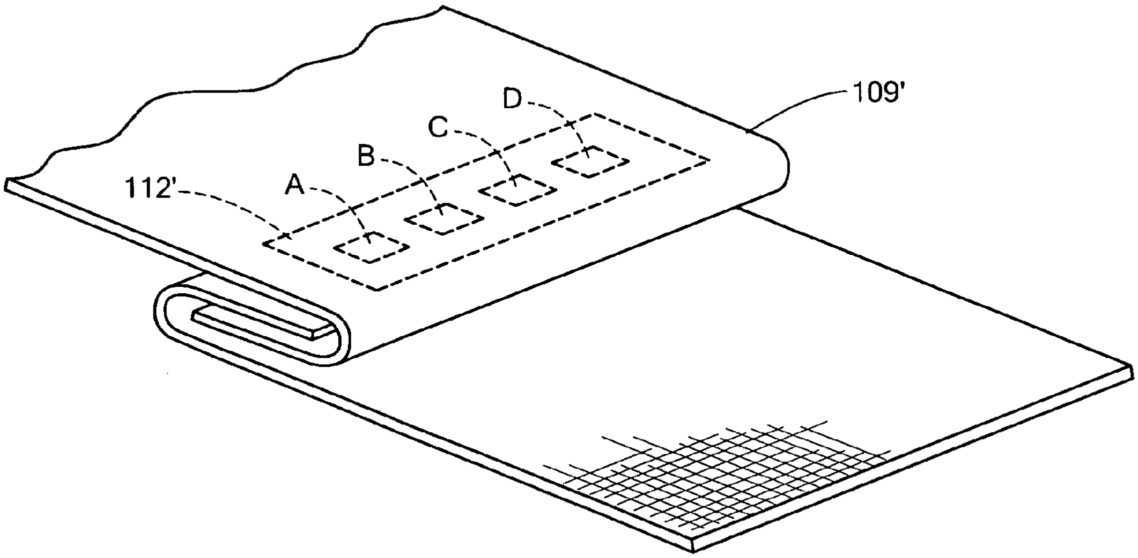
FIG. 5 is a schematic three-dimensional top view of two fabric pieces joined by a seam depicting how select conductors are electrically and mechanically connected.
Figure 6:
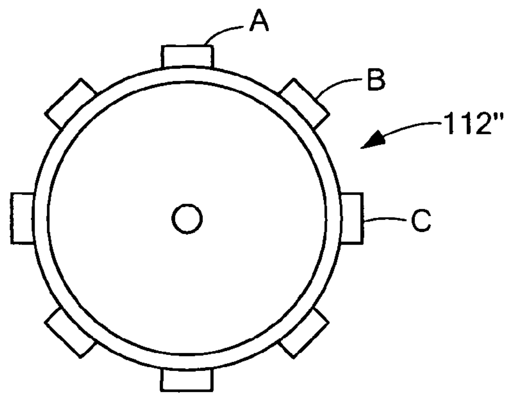
FIG. 6 is a schematic end view showing one example of a specialized ultrasonic horn useful in accordance with the subject inventions.

FIG. 5 shows a seam being welded by ultrasonic horn 112' with active portions A, B, C, and D preconfigured to mechanically and electrically interconnect conductors only at corresponding select locations A, B, C, and D in seam 109. FIG. 6 shows an ultrasonic head 112" of a machine which with active portions A, B, C, and the like configured to roll over a seam mechanically and electrically connecting conductors at the predetermined selected locations. The size and spacing of the active portions will depend on which selected conductors are to be interconnected and the seam type.

Other suitable formation techniques include welding using heat and pressure such as by the use of a heated platen, radio frequency welding either in a continuous or discontinuous fashion along the seam, inductive welding, and the like.

As stated above, a decision is made which conductors of the first fabric piece intersect or overlap with which conductors of the second fabric piece and also, for all those intersections, which select conductors of the first fabric piece will be electrically and mechanically connected to which select conductors of the second fabric piece. The predetermined factors used in determining at the seam which conductors of the first fabric piece intersect with which conductors of the second fabric piece typically include the seam type, the distance between conductors in each fabric piece, and/or any twist angle between the first and second fabric pieces at the seam.

Figure 7:
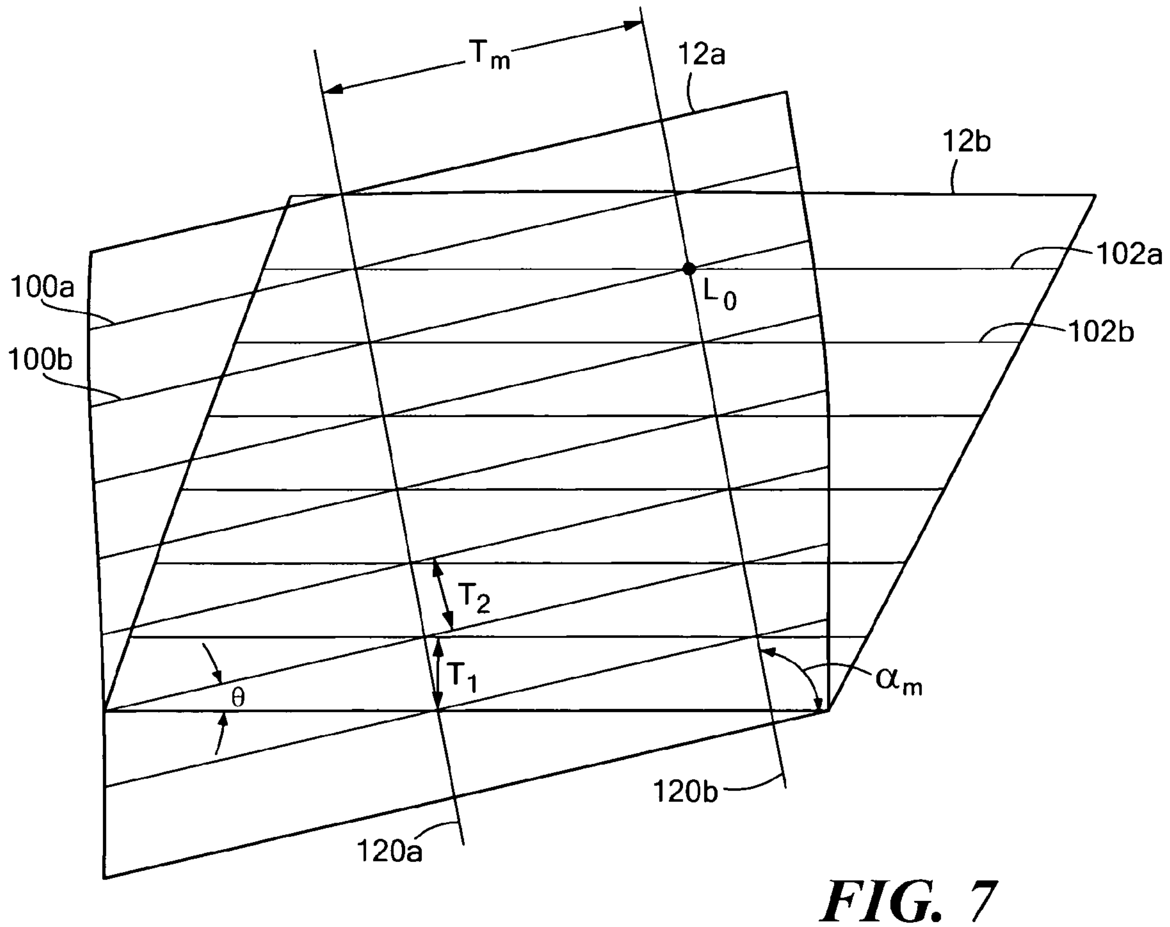
FIG. 7 is a schematic depiction showing two joined fabric pieces each including conductors illustrating the various predetermined factors taken into account in accordance with the subject invention when determining which conductors of the first fabric piece intersect with which conductors of the second fabric piece.

FIG. 7 shows a distance $T_2$ as the distance between conductors in each fabric piece and a twist angle θ between fabric piece 12*a* and fabric piece 12*b* at the seam. In this particular example, the intersecting conductors form moiré fringe lines 120*a* and 120*b*. The location of these fringe lines can be mathematically determined ahead of time. Here, the predetermined factors further include the distance $T_m$ between fringe lines 120*a* and 120*b* and the angle $\alpha_m$ at which they extend relative to a reference frame (e.g., one edge of fabric piece 12*b*). In this particular example, location $L_o$, the intersection of conductor 100*b* in fabric piece 12*a* and conductor 102*a* and fabric piece 12*b*, is chosen as a select location on fringe line 120*b* to mechanically and electrically connect two intersecting conductors. Other intersecting conductors on the fringe lines can also be selected in this manner. But, it is not typically the case where all the intersecting conductors along both fringe lines 120*a* and 120*b* are selected.

There are numerous seam types laid out in industry standards such as ASTM D6193-97: Standard Practice for Stitches and Seams. This document addresses the numerous ways in which at least two cut fabrics can be overlapped to allow stitching to join them. In addition, the stitch types are documented which are numerous and involve at least one thread to as many as four. Adding to this variability is the cut of the fabric that defines the interface that must be joined which can be at any angle to the grain of the fabric (also known as the warp and well for woven fabrics). The second piece of fabric, which will be joined to the first, can also have a different cut, or angle to the grain. If, for a simple example, the network is a series of parallel conductive threads in the warp direction in both pieces of fabric with angular cuts, it is nearly impossible to visually determine where a particular set of network threads may overlap to allow a connection to be made.

The location of the conductor overlap in a seam can be modeled through understanding of interfaces. There are two types of interfaces between two periodic structures: a twist boundary and a tilt boundary. While the relationship between two pieces of fabric in a seam is a tilt boundary, the region of overlap—or potential for connection—is a twist boundary. This subtlety is not immediately obvious and the equations governing each are significantly different.

Moiré Phenomenon Theory also governs twist boundaries. When two periodic or aperiodic planar structures are overlapped, a series of secondary periodic structures is made by the interference between the original structures. This second periodic structure, commonly called a Moiré pattern, is related to coincidence (i.e. overlap) of the independent patterns. Thus, in the simplest case, the overlap in a seam of two fabrics with conductors woven into the warp can be modeled using Moiré theory. As all seams have at least one discrete overlap region, Moiré theory can be used to define the best conditions for ultrasonic welding (placement, head size, and continuous or discrete) and optimal network design (i.e. weave pattern, yarn design, etc.) for the desired power or data network.

FIG. 7 illustrates the parameters of the twist boundary, also known as an angular shift in Moiré theory for two line patterns. T1 and T2 are the distances between the conductors in fabric pieces 12*a* and 12*b*. θ is the angle of twist or misalignment between the grains of the two fabrics. From these parameters, the Moiré pattern that resulted from the overlap of the two period line structures can be characterized by Tm and αm:

$$Tm = \sqrt{\frac{T_1^2 + T_2^2 - 2T_1T_2\mathrm{Cos}\alpha}{\mathrm{Sin}^2\alpha}} \quad (1)$$

$$\alpha m = \mathrm{Sin}^{-1}\left(\frac{T_1}{T_m}\right) \quad (2)$$

where Tm is the distance between the periodic Moiré fringes and αm is the angle they make with respect to the reference coordinate system. Expanding upon this to include the angles of the fabric cut with respect to the fabric grain and the seam angle, an effective periodicity along the seam of active overlap points can be calculated. The seam type influences the relationship between the fabric cut angles and the twist angle (theta). As the complexity of the woven or knit network increases, the calculation complexity at the seam also increases. The presence of both weft and warp conductors results in multiple moiré patterns and therefore additional overlaps that are rendered joined when a small region is welded. For simple power networks, this can be overcome, but when designing data networks, these additional connections result in electrical shorts. Careful design of the conductive pattern in the fabrics as well as proper used of seam types in concert can result in higher data protocols being preserved across the seam interface.

Figure 8:
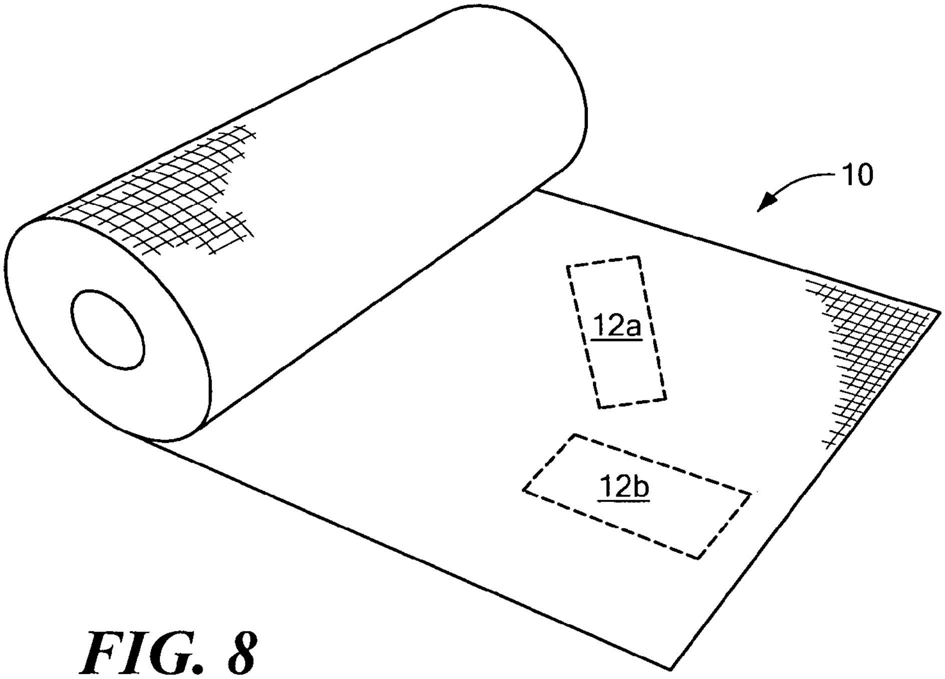
FIG. 8 is a highly schematic three-dimensional view showing one example of electrically active textile material in accordance with an example of the subject invention.

FIG. 8 shows an example of electrically active textile 10 with garment pattern pieces 12*a* and 12*b* laid out. When these patterned pieces are cut from the bulk textile, they are joined together to form a garment, for example, a shirt, jacket, or an article such as a backpack, tent, or the like. Broadloom fabrics are typical but not all the patterned pieces of a given garment need include conductors.

Figure 9:
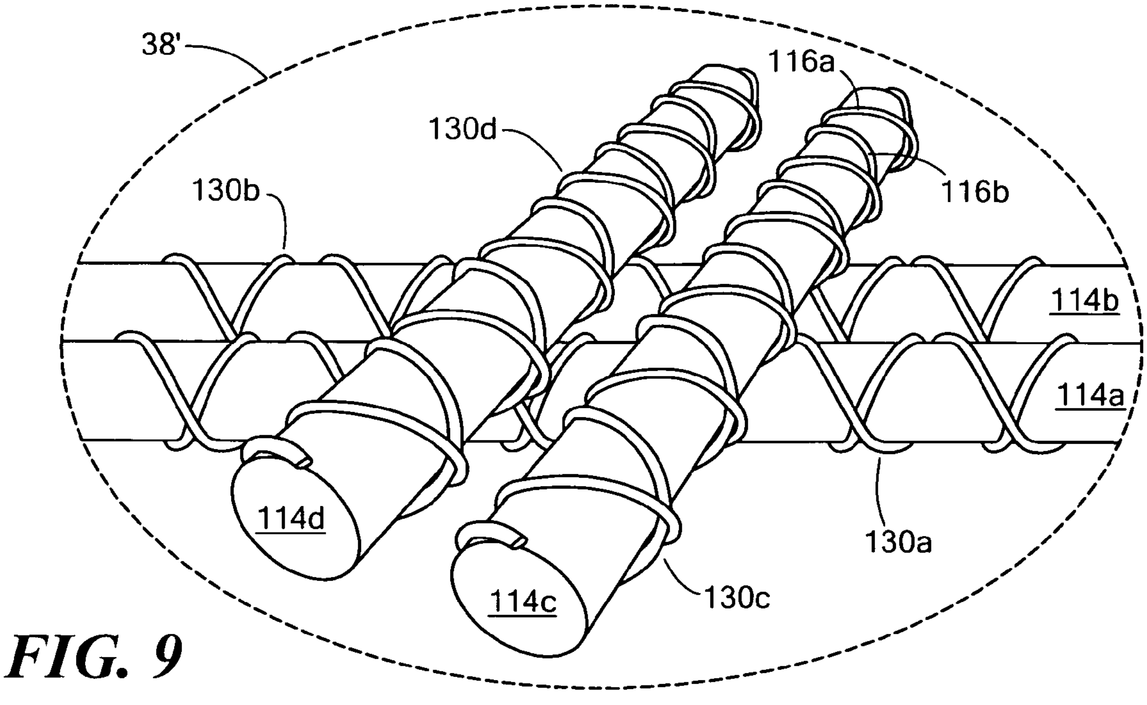
FIG. 9 is a highly schematic view showing an example of several individual conductors of the textile material shown in FIG. 8.

FIG. 9 shows one particular example where woven fibers 114*a*, 114*b*, 114*c*, and 114*d* made of, for example, a 50/50 nylon/cotton blend. Some polymeric content is preferred. Fibers 114*a* and 114*b* run in the warp direction while fibers 114*c* and 114*d* run in the weft direction. In this particular example, all the fibers of textile 10, FIG. 8 include, as shown for fiber 14*c*, two or more conductive wires 116*a*, 116*b*, and the like wrapped about the fibers rendering fibers 116*a*-116*d* conductors 130*a*-130*d*, respectively.

Wires 116*a*, 116*b*, and the like are typically very small insulated copper wires (e.g., having a diameter of between 14 μm (58 AWG) and 93 μm (40 AWG)). Weaving conductors 130*a*-130*d* is carried out using known processes.

The result is a garment-based electrical network which is made of fabric much more comfortable than when normal fibers in the textile are replaced with wires. And, since wires 116*a*, 116*b*, and the like are insulated, conductor 130*a*, for example, is not electrically connected to conductor 130*c*. All or any select fibers of the textile may be rendered conductive in this fashion.

Figure 10:
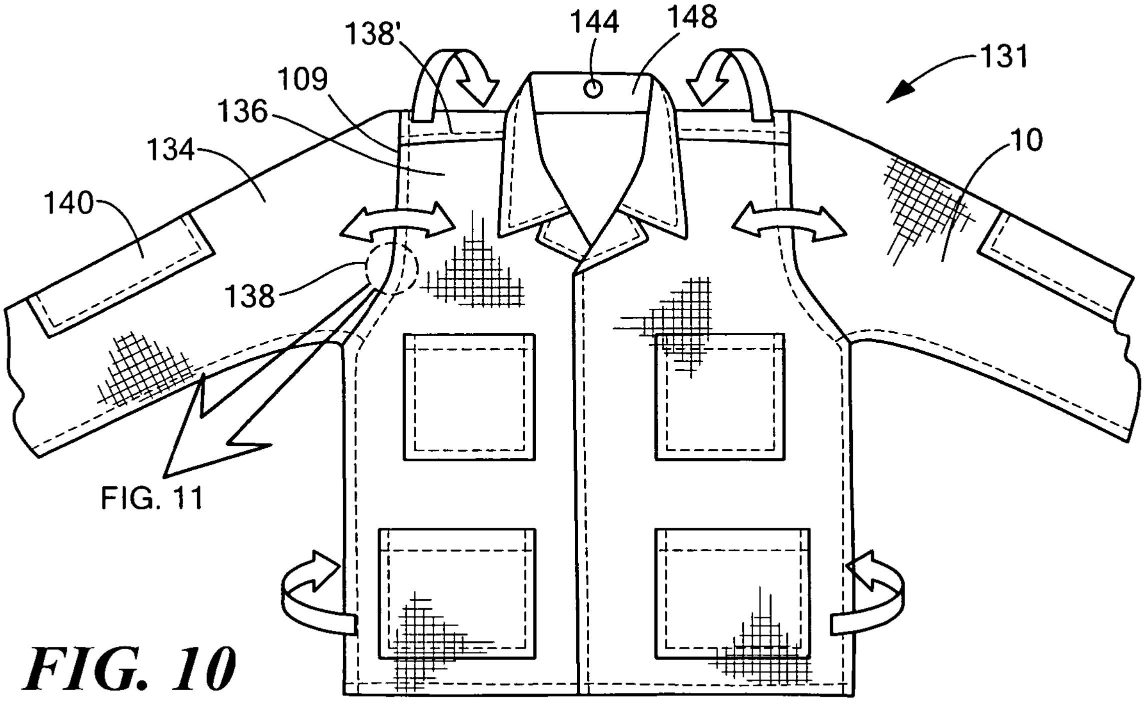
FIG. 10 is a schematic front view of an example of a garment made in whole or in part of the electrically active textile material shown in FIG. 8.

A garment such as shirt 131, FIG. 10, can now be fabricated using, for example, pattern pieces 12*a* and 12*b*, FIG. 8 cut from broadloom textile article 10 and assembled as is known in the art. All or only select portions of garment 131 may be made of electrically active "e-textile" material as discussed above. During the assembly of the pattern pieces or thereafter, it may be desirable to electrically connect at least select conductors at select locations on garment 131, FIG. 10. When pattern pieces 12*a* and 12*b*, FIG. 8 are cut from e-textile material 10, note that the insulated wires at the periphery of each pattern piece are also cut.

In one example, as shown in FIG. 10, consider seam 109 between arm piece 134 and front shirt panel 136. Seam 109 is also reproduced in FIG. 11. At select location 138 on garment 131, FIG. 10, it may be desirable to electrically connect at least select conductors, for example, predetermined intersecting conductors 130*a*-130*d*, FIG. 9.

Figure 11:
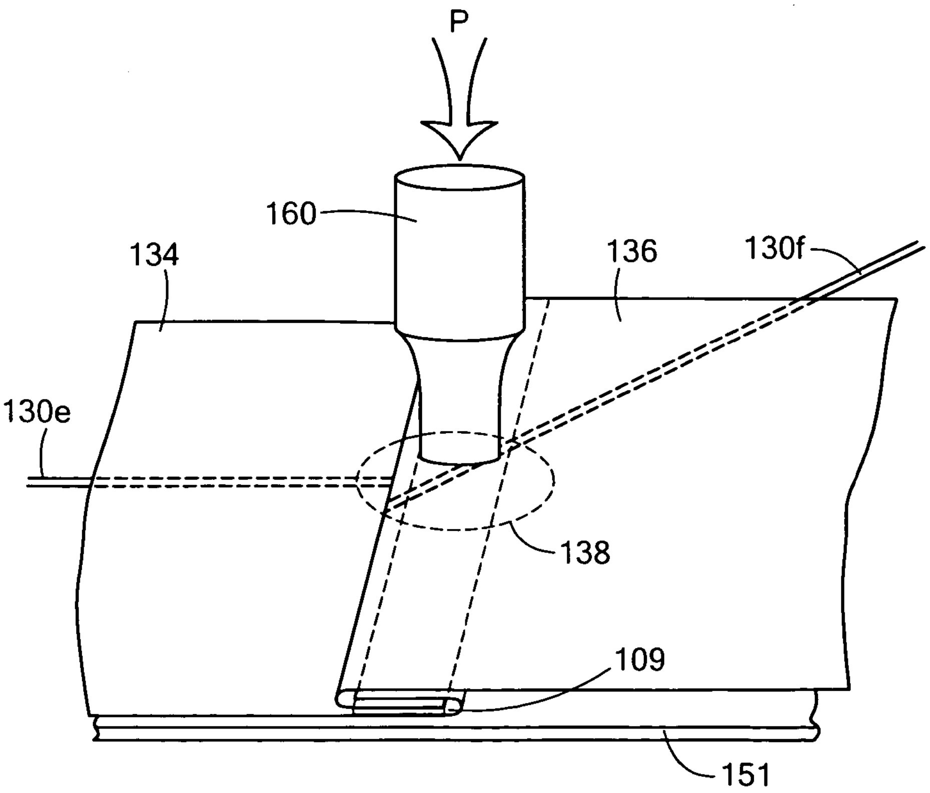
FIG. 11 is a highly schematic three-dimensional top view showing how the conductors in one portion of the garment of FIG. 10 are electrically connected to the conductors present in another portion of the garment at a seam between fabric pieces.

In but one example, pocket 140, FIG. 10 on sleeve 134 may house a hand-held electronic device with a headphone output electrically connected to conductors running in arm section 134. These conductors need to be electrically connected to conductors in front shirt panel 136 which themselves are electrically connected port 144 on collar 148 configured for a pair of headphones. FIG. 11 shows conductor 130*e* in sleeve section 134 to be electrically connected to conductor 130*f* in front shirt panel 136. These two conductors, as explained above, have been determined to intersect at a precise location at seam 109 and are selected for mechanical and electrical interconnection.

In accordance with an example of the subject invention, seam 109 is laid on platen 151 and ultrasonic horn 160 is applied to select location 138. Pressure P is applied to ultrasonic horn 160 and it is energized to melt the insulation of the wires wrapped about the fabric fibers and also to melt the polymeric material of the fibers themselves. The copper or other metallic or conductive cores of the wires then come into physical contact with each other to establish electrical continuity between, for example, conductors 130*e* and 130*f*.

The horn is then deenergized and, while pressure P is still applied to horn 160, the polymeric fiber material cools encapsulating the now touching copper wire cores keeping them in electrical and physical contact. The size of horn 160 is selected as discussed above to only interconnect the selected conductors.

If other conductors of sleeve section 134 are selected to be in electrical continuity with other conductors of front panel section 136, horn 160, while energized, can be moved to other selected locations. Indeed, this technique can be used to physically join arm section 134 to front shirt panel section 136. This technique can also be used at the other seams of garment 131, e.g., the seams shown at 138' and 138".

In the example of FIG. 9, conductors 130*a* and 130*b* running in the warp direction can be electrically connected to conductors 130*c* and 130*d* running in the weft direction by applying an ultrasonic horn at location 138'. Under the application of ultrasonic energy and pressure, the insulation about wires 116*a* and 116*b* melts as does the nylon material present in fiber 114*c*. Similarly, the insulation about the other wires wrapped about the other fibers melts as does the nylon or other polymeric material present in the other fibers. The copper cores of all the wires come into contact with each other and, after the ultrasonic energy is stopped, the melted nylon material cools encapsulating the connected copper wire cores. The result is a durable, insulated connection achieved in an economical fashion.

In experiments, an ultrasonic horn with a replaceable tip was energized to 20 kHz. A catenoidal horn was used and the power level was 20 with 20 psi horn pressure, weld time of 0.25 s, and a hold time of 10 s on an anvil.

Figure 12:
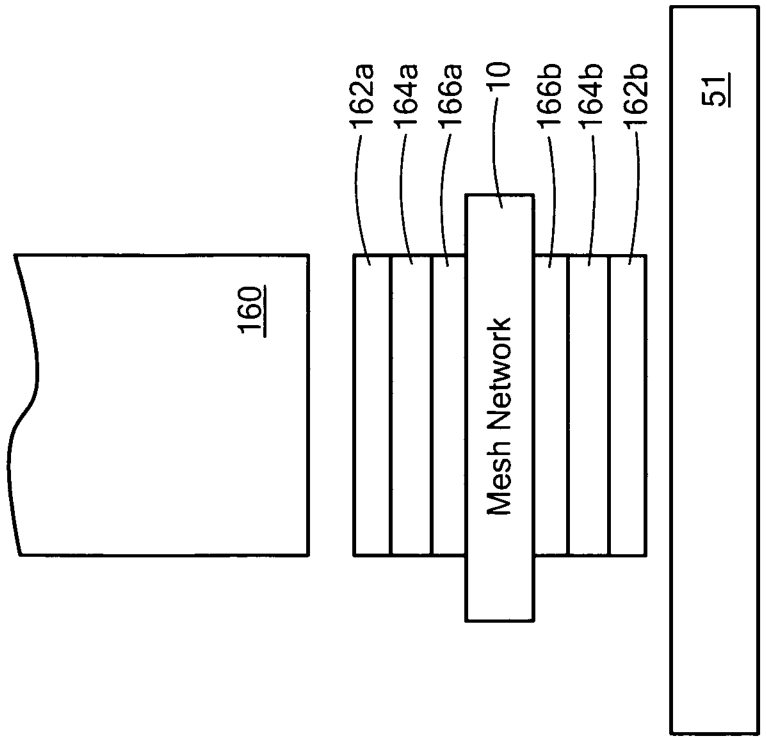
FIG. 12 is a schematic cross-sectional front view showing how an electrical connection can be made to a mesh network fabric article in accordance with the subject invention.

In still another example, location 161, FIG. 12 in textile mesh network 10 is designated as a location where a connector needs to be placed to facilitate an electrical connection between the fabric and an external electrical device. FIG. 12 shows regular fabric patches 162*a* and 162*b*, foil patches 164*a* and 164*b*, and e-textile patches 166*a* and 166*b* sandwiching mesh network fabric piece 10. Mesh network fabric piece 10 and e-textile patches 166*a* and 166*b* may all be constructed with conductors as discussed above.

When location 160 is placed on platen 151, and ultrasonic horn 160 is brought to bear on the lay up at location 161 and energized. Conductors in layers 166*a*, 10, and 166*b* electrically connect and the nylon or other polymeric material in layers 162*a*, 166*a*, 10, 166*b*, and 162*b* melts encapsulating the copper wires now in contact with each other and also joining all the layers 162*a*, 164*a*, 166*a*, 10, 166*b*, 164*b*, and 162*b* together. A snap or other connector can now be added through the thickness of these layers at location 161 for electrical connection to the conductors of mesh network 10. The result is a durable insulated connector where the conductors are in electrical contact. In one example, headphones port 144, FIG. 10 is formed in this way.

Figure 13:
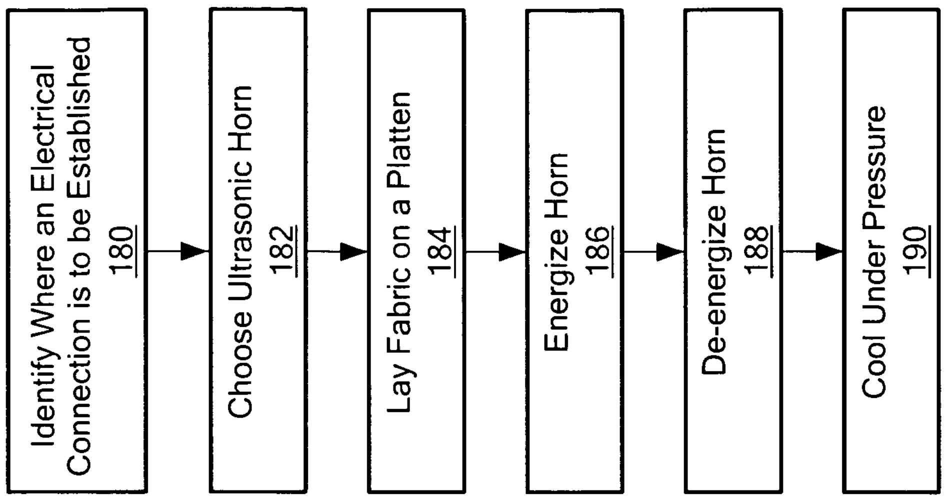
FIG. 13 is a flow chart depicting the primary steps associated with an example of a method of making electrical connections amongst select conductors in an e-textile article in accordance with the subject invention.

FIG. 13 depicts the primary steps associated with electrically connecting select conductors of an e-textile article or garment in accordance with one example. First, in step 180, a location is identified where an electrical connection is to be made. This location may be a seam, a location where conductors running in the weft direction are to be electrically connected to conductors running in the warp direction, and/or a connection location as discussed above. In step 182, the appropriate ultrasonic horn is chosen depending upon the area to be addressed, the conductors which intersect other conductors and the selected intersecting conductors to be electrically and mechanically connected. The pressure to be applied, the energy level applied to the ultrasonic horn, dwell times, and the like, may vary depending upon the material used and other factors. The e-textile fabric is then laid on a platen, step 184. The horn is placed in the selected location and energized, step 186, to melt the insulation surrounding the conductive core of the wires wrapped about the fibers at the selected location and also to melt the polymeric material present in the fibers. Pressure is typically applied to the horn as discussed above. After a sufficient dwell time, the horn is deenergized, step 188, and the polymeric material is allowed to cool, step 190, typically while pressure is still applied to the ultrasonic horn.

The result is a more comfortable and versatile electrically active fabric including, in this particular example, conventional yarn or fibers wrapped with small insulated wires. Termination of signal lines and unwanted connections is not a concern since the wires are insulated. Electrically connecting groups of these conductors is cost effective using ultrasonic welding techniques. During the ultrasonic welding process, the plastic insulation of the wires melts, the plastic material in the yarn or fibers melts, and the conductive cores of the wires come into contact. The plastic material of the yarn or fibers cools, hardens, and retains the conductive cores of the wires in contact with each other.

The subject invention thus includes technologies for making electronic networks using materials and manufacturing methods which can be easily implemented in the textile industry. Applications include numerous instances where the ability to transmit data and power in fabrics is desirable. Applications may include garments for military and emergency personnel, air-field structures such as high altitude air ships and deployable space-craft, and wearable electronics. Soft-walled shelters, personal load carriage equipment such as backpacks, and other applications are possible.

Although specific features of the invention are shown in some drawings and not in others, this is for convenience only as each feature may be combined with any or all of the other features in accordance with the invention. The words “including”, “comprising”, “having”, and “with” as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A method of making an electrically active article, the method comprising:

- wrapping one or more insulated wires about a fiber including a polymeric material to render said fiber a conductor;
- weaving a plurality of said conductors into a fabric;
- cutting said fabric into pieces according to a pattern;
- assembling said pieces together via seams to form a garment or article; and
- electrically connecting at least select conductors at a seam by:
  - laying the seam on a platen,
  - applying an ultrasonic horn to at least a portion of the seam,
  - applying pressure to the ultrasonic horn,
  - energizing the ultrasonic horn to bare wires and to melt the polymeric material,
  - deenergizing the ultrasonic horn, and
  - allowing the polymeric material to cool encapsulating the wires.

2. The method of claim 1 in which said fibers include a blend of synthetic and natural fibers.

3. The method of claim 1 in which all the fibers of said fabric are conductors.

4. The method of claim 1 further including determining mathematically, at the seam, based on one or more predetermined factors, which conductors of a first fabric piece overlap with which conductors of a second fabric piece.

5. The method of claim 4 in which the predetermined factors include the seam type, the distance between conductors in each fabric piece, and/or any twist between the first and second fabric pieces at the seam.

6. The method of claim 4 in which the overlap conductors at the seam form Moiré fringe lines and the predetermined factors further include the distance between the fringe lines and/or the angle at which they extend.

7. The method of claim 1 further including forming electrical and mechanical connections between select warp and weft conductors within a single fabric piece.

8. The method of claim 1 in which the electrically active article includes locations designated for connector placement that are prepared by welding a patch comprised of foil and fabric over a designated conductor thereby forming an electromechanical connection with the electrically active textile article.

9. The method of claim 8 in which forming an electrical and mechanical connection includes, for fabrics with insufficient polymeric content, adding a polymeric patch that covers the foil patch.

10. The method of claim 1 in which forming an electrical and mechanical connection includes, for fabrics without any polymeric content, adding a polymeric patch.

* * * * *

UNITED STATES PATENT AND TRADEMARK OFFICE

CERTIFICATE OF CORRECTION

PATENT NO. : 9,009,955 B2
APPLICATION NO. : 12/804957
DATED : April 21, 2015
INVENTOR(S) : Slade et al.

It is certified that error appears in the above-identified patent and that said Letters Patent is hereby corrected as shown below:

Title Page, Item (75) Inventors, should read

-- (75) Inventors: Jeremiah Slade, Shirley, MA (US);
Andrew Houde, Lowell, MA (US);
Patricia Wilson, Arlington, MA (US);
Carole Winterhalter, Marlboro, MA (US) --.

Signed and Sealed this
Eighth Day of March, 2016

Michelle K. Lee
*Director of the United States Patent and Trademark Office*